(12) United States Patent
Yu et al.

(10) Patent No.: US 10,501,326 B2
(45) Date of Patent: Dec. 10, 2019

(54) SILICA AEROGEL-INCLUDING BLANKET AND METHOD FOR PREPARING THE SAME

(71) Applicant: LG CHEM, LTD., Seoul (KR)

(72) Inventors: Sung Min Yu, Daejeon (KR); Kyoung Shil Oh, Daejeon (KR); Je Kyun Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/547,970

(22) PCT Filed: Mar. 28, 2016

(86) PCT No.: PCT/KR2016/003153
§ 371 (c)(1),
(2) Date: Aug. 1, 2017

(87) PCT Pub. No.: WO2017/043721
PCT Pub. Date: Mar. 16, 2017

(65) Prior Publication Data
US 2018/0029892 A1    Feb. 1, 2018

(30) Foreign Application Priority Data

Sep. 10, 2015  (KR) .................. 10-2015-0128547
Mar. 28, 2016  (KR) .................. 10-2016-0036566

(51) Int. Cl.
*C01B 33/158* (2006.01)
*C01G 23/047* (2006.01)
(Continued)

(52) U.S. Cl.
CPC ........ *C01B 33/1585* (2013.01); *C01G 23/047* (2013.01); *B01D 11/0203* (2013.01); *C08G 77/02* (2013.01); *C08G 77/18* (2013.01)

(58) Field of Classification Search
CPC ............ B01D 11/0203; C01B 33/1585; C01B 33/159; C01G 23/047; C01P 2002/88;
(Continued)

(56) References Cited

U.S. PATENT DOCUMENTS 5,789,075 A    8/1998  Frank et al.
5,877,100 A    3/1999  Smith et al.
(Continued)

FOREIGN PATENT DOCUMENTS

CN    1803602 A     7/2006
JP    05-279011 A  10/1993
(Continued)

OTHER PUBLICATIONS

Cabot, Enova Aerogel coatins for high performance applications, 2013 Cabot Corporation, p. 1-6 (Year: 2013).*
(Continued)

*Primary Examiner* — Amber R Orlando
*Assistant Examiner* — Syed T Iqbal
(74) *Attorney, Agent, or Firm* — Dentons US LLP

(57) ABSTRACT

The present disclosure provides a silica aerogel-including blanket including a substrate for a blanket; and a silica aerogel and an opacifying agent locating at least one of on a surface of and inside the substrate for a blanket, wherein the opacifying agent is a second particulate with inorganic particles of a first particulate being aggregated, and includes 1 to 5 of the inorganic particles per unit volume of 1 μm³, and a method for preparing the same. The silica aerogel-including blanket according to the present disclosure is capable of exhibiting flame retardancy as well as an excellent insulation property, particularly, an excellent insulation property at high temperatures, by including an opacifying agent having excellent dispersibility and high surface activity through chemical etching.

10 Claims, 7 Drawing Sheets

(51) Int. Cl.
  *C01B 33/159* (2006.01)
  *H01L 23/373* (2006.01)
  *B01D 11/02* (2006.01)
  *C08G 77/02* (2006.01)
  *C08G 77/18* (2006.01)

(58) Field of Classification Search
  CPC .............. C01P 2004/04; C01P 2004/61; C01P 2004/62; C08G 77/02; C08G 77/18
  See application file for complete search history.

(56) References Cited

U.S. PATENT DOCUMENTS

| 2001/0034375 | A1 | 10/2001 | Schwertfeger et al. |
| 2006/0157101 | A1 | 7/2006 | Sakamoto et al. |
| 2011/0206471 | A1 | 8/2011 | Doshi et al. |
| 2013/0106008 | A1* | 5/2013 | Ahn .................... C01B 33/1585 264/5 |
| 2014/0273701 | A1* | 9/2014 | Samanta .................... E04B 1/78 442/334 |
| 2016/0032584 | A1 | 2/2016 | Doshi et al. |
| 2016/0333572 | A1 | 11/2016 | Samanta et al. |

FOREIGN PATENT DOCUMENTS

| JP | 2000-034123 A | 2/2000 |
| KR | 10-2000-0048699 A | 7/2000 |
| KR | 10-2000-0057244 A | 9/2000 |
| KR | 10-0385829 B1 | 10/2003 |
| KR | 10-2011-0126381 A | 11/2011 |
| KR | 10-2012-0116944 A | 10/2012 |
| KR | 10-2013-0116632 A | 10/2013 |
| WO | 2012/044052 A2 | 4/2012 |

OTHER PUBLICATIONS

Berg et al. "The relationship between pH and zeta potential of ~30nm metal oxide nanoparticle suspensions relevant in vitro toxicology evaluations", Nanotoxicology, Dec. 2009; 3(4); 276-283 (Year: 2009).*
Yao, Tianyang, et al.: "3.1.3 Strength of Protonic Acids (Bases)", University Chemistry, published by Nanjing chemistry press, vol. I, May 31, 2014, p. 61.
Kwon et al., "Ambient-dried silica aerogel dope with TiO2 powder for thermal insulation," Journal of Materials Science, Kluwer Academic Publishers vol. 35, No. 24, pp. 6075-6079 (2000).
Zhang et al., "Synthesis, Structural and Thermal Properties of Nano-porous SiO2-based Aerogels," Advances in Nanocomposites—Synthesis, Characterization and Industrial Applications, 23 pages (2011) (retrieved from the Internet: URL:http://cdn.intechnopen.com/pdfs/15399/InTech-Synthesis_structural_and_thermal_properties_of_nano_porous_sio2_based-aerogels.pdf, on Nov. 3, 2017).
Bo Yuan et al., Heat insulation properties of silica aerogel/glass fiber composites fabricated by press forming, Materials Letters, 2012, vol. 75, pp. 204-206.

* cited by examiner

US 10,501,326 B2

SILICA AEROGEL-INCLUDING BLANKET AND METHOD FOR PREPARING THE SAME

FIELD OF THE INVENTION

This application is a National Stage Entry of International Application No. PCT/KR2016/003153 filed on Mar. 28, 2016, and claims the benefit of Korean Application No. 10-2015-0128547 filed on Sep. 10, 2015, and Korean Application No. 10-2016-0036566 filed on Mar. 28, 2016, all of which are hereby incorporated by reference in their entirety for all purposes as if fully set forth herein.

The present disclosure relates to a silica aerogel-including blanket having flame retardancy as well as an excellent insulation property, and a method for preparing the same.

DESCRIPTION OF THE RELATED ART

With recent modernization of industrial technologies, interests on aerogels having an excellent insulation property have been increasing. Aerogels that have been developed so far include organic aerogels such as resorcinol-formaldehyde or melamine-formaldehyde aerogel particles, and inorganic aerogels including metal oxides such as silica ($SiO_2$), alumina ($Al_2O_3$), titania ($TiO_2$) or carbon (C) aerogels.

Among these, silica aerogels are a highly porous material having high porosity and specific surface area, and low thermal conductivity, and are expected to be used in various fields such as insulation materials, catalysts, sound absorbing materials or layer insulation materials of a semiconductor circuit. Although a pace of commercialization is very low due to a complicated preparing process, low mechanical strength and the like, a pace of market expansion including insulation materials has gradually increased as a result of consistent researches.

Silica aerogels have low mechanical strength due to a porous structure thereof, and are normally commercialized in the form of aerogel blankets or aerogel sheets composited with substrates such as glass fibers, ceramic fibers or polymer fibers.

However, aerogel powder is weakly attached to a substrate fiber for a blanket, and therefore, is readily detached during operation, and the degree of environmental contamination is serious due to heavy powder flying. In addition, density and mechanical strength of the aerogel itself are very low, and there are difficulties in commercializing the aerogel in the form of sheets or boards.

Meanwhile, in order to maximize effects as an insulation material, particularly, an insulation material for high temperatures when preparing a silica aerogel-including blanket, an opacifying agent having absorptivity for wavelengths in an infrared (IR) region at high temperatures has been used.

However, existing opacifying agents have large particle sizes, which lead to a problem of low dispersibility and quick precipitation. In view of the above, methods of increasing dispersibility of an opacifying agent in a synthesis reaction system using various types of dispersion agents have been proposed, however, dispersion agents are mostly made of organic substances, and have a problem in reducing a flame retardant property of a finally produced blanket including a silica aerogel, and producing dust particles.

In addition, existing opacifying agents have low surface activity of particle itself, and are not readily chemically bound to a silica precursor. Therefore, the content of an opacifying agent in a prepared blanket is significantly low, and effects of improving insulation performance obtained by the use of the opacifying agent have not been high.

DISCLOSURE OF THE INVENTION

Technical Problem

The present disclosure is directed to providing a silica aerogel-including blanket having flame retardancy as well as an excellent insulation property, and a method for preparing the same.

The present disclosure is also directed to providing an insulation material prepared using the blanket including a silica aerogel.

The present disclosure is also directed to providing an opacifying agent-including dispersion liquid useful in preparing the blanket including a silica aerogel.

Technical Solution

The present disclosure has been made in view of the above, and one embodiment of the present disclosure provides a silica aerogel-including blanket including a substrate for a blanket; and a silica aerogel and an opacifying agent locating at least one of on a surface of and inside the substrate for a blanket, wherein the opacifying agent is a second particulate with inorganic particles of a first particulate being aggregated, and includes 1 to 5 inorganic particles per unit volume of 1 $\mu m^3$.

Another embodiment of the present disclosure provides a method for preparing a silica aerogel-including blanket, the method including preparing an opacifying agent-including dispersion liquid by dispersing inorganic particles into an aqueous basic solution and etching the particles, and then adding water thereto; preparing an opacifying agent-including composition for forming a silica aerogel by mixing the opacifying agent-including dispersion liquid with a silica precursor-including solution; preparing an opacifying agent-silica gel-substrate complex by adding a base catalyst and a hydrophilic polar organic solvent to the opacifying agent-including composition for forming a silica aerogel, and then adding a substrate for a blanket thereto and gelling the result; and surface hydrophobizing the opacifying agent-silica gel-substrate complex and then drying the result.

Still another embodiment of the present disclosure provides an insulation material prepared using the blanket including a silica aerogel.

Yet another embodiment of the present disclosure provides an opacifying agent-including dispersion liquid including an opacifying agent and water, wherein the opacifying agent has average zeta-potential of −10 mV to −60 mV in the water.

Advantageous Effects

A silica aerogel-including blanket according to the present disclosure is capable of exhibiting flame retardancy as well as an excellent insulation property, particularly, an excellent insulation property at high temperatures, by including an opacifying agent having excellent dispersibility, dispersion stability and high surface activity through chemical etching.

DESCRIPTION OF DRAWINGS

The following drawings attached to the present specification illustrate preferred embodiments of the present disclosure, and perform a role of further illuminating technological ideas of the present disclosure together with the contents of the disclosure described above, and therefore, the present disclosure is not to be interpreted to be limited to such descriptions provided in the drawings.

MODE FOR CARRYING OUT THE INVENTION

Figure 1:
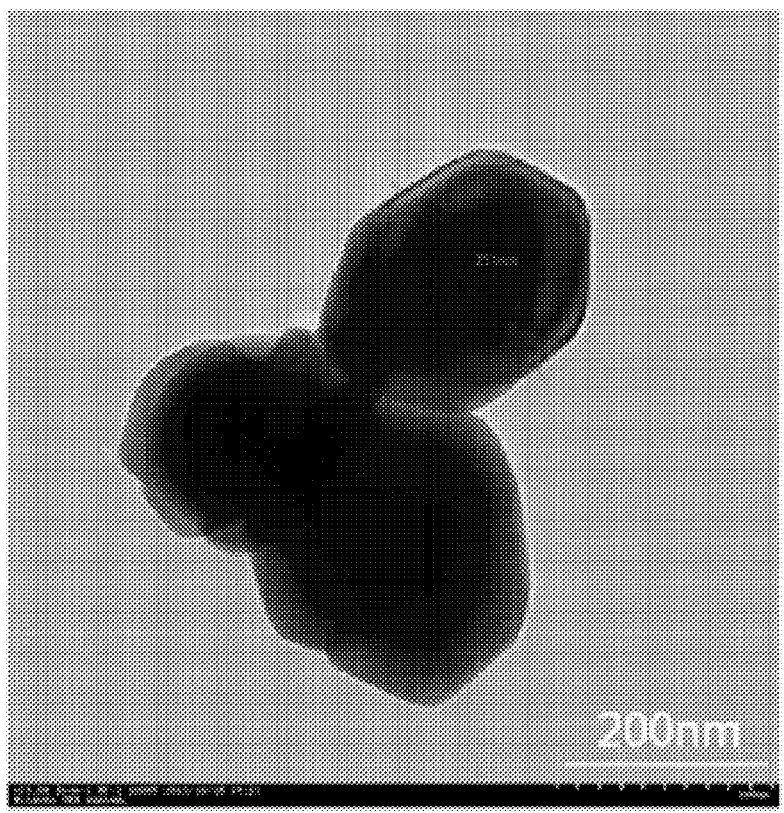
FIG. 1 is a transmission electron microscope (TEM) picture observing an opacifying agent prepared in Example 1.

Hereinafter, the present disclosure will be described in more detail in order to illuminate the present disclosure.

Terms or words used in the present specification and the claims are not to be interpreted limitedly to common or dictionary meanings, and shall be interpreted as meanings and concepts corresponding to technological ideas of the present disclosure based on a principle in which inventors may suitably define the concepts of terms in order to describe their own invention in the best possible way.

When preparing a silica aerogel-including blanket using an opacifying agent in the present disclosure, surface activity of the opacifying agent increases while reducing particle sizes thereof through chemical etching, and therefore, an insulation property, particularly, an insulation property at high temperatures, and flame retardancy of a blanket may be enhanced when preparing the blanket through increasing dispersibility and dispersion stability of the opacifying agent in a reaction system without using a dispersion agent, and increasing surface activity at the same time.

In other words, a silica aerogel-including blanket according to one embodiment of the present disclosure includes a substrate for a blanket; and a silica aerogel and an opacifying agent locating at least one of on a surface of and inside the substrate for a blanket, wherein the opacifying agent is a second particulate with inorganic particles of a first particulate being aggregated, and has 1 to 5 inorganic particles per unit volume of 1 μm$^3$.

In the present disclosure, a "first particle" or "first particulate" means being formed with a single particle, and a "second particle" or "second particulate" means a structure forming a relatively large particle form by two or more first particles being aggregated through physical and/or chemical binding.

In addition, in the present disclosure, the number of inorganic particles per unit volume is an average value.

Specifically, in the blanket including a silica aerogel, the opacifying agent is prepared by chemically etching inorganic particles using a strong base. Herein, particle sizes and zeta-potential on the surface may be controlled through controlling the concentration of the base for etching and time of the etching process, and in the present disclosure, the etching process is controlled so that excellent dispersibility and dispersion stability are obtained when preparing the blanket including a silica aerogel, and as a result, the opacifying agent used in the present disclosure has smaller and uniform particles compared to opacifying agents used in the art. In addition, excellent binding force is obtained for the silica aerogel and the substrate for a blanket due to high surface activity of the opacifying agent.

In detail, the preparation of the silica aerogel-including blanket according to one embodiment of the present disclosure is carried out under a hydrophilic condition such as using water. When inorganic particle sizes are excessively large under such a hydrophilic condition, precipitation readily occurs due to the density of the inorganic particle itself. In addition, the value of zeta-potential on the inorganic particle surface being high means that many functional groups are distributed on the particle surface regardless of the value being positive or negative, and more superior dispersibility may be obtained as a result. When inorganic particles are uniformly dispersed by controlling inorganic particle sizes and surface zeta-potential as described above, reactions such as a condensation reaction with a silica precursor may occur uniformly and more efficiently.

More specifically, the opacifying agent may have average zeta-potential of −10 mV to −60 mV in the water, a dispersion medium.

In the present disclosure, "zeta-potential" is an indicator representing the degree of surface electric charge quantity of colloidal particles floating inside a liquid. When an electric field is applied to colloid from the outside, the colloidal particles move in a direction opposite to the surface potential sign thereof, and herein, the value calculating the particle moving rate considering the intensity of the applied electric field and hydrodynamic effects (solvent viscosity, dielectric constant and the like) is zeta-potential. In other words, as the absolute value of zeta-potential increases, repulsion force between particles becomes stronger enhancing the degree of dispersion and dispersion stability, and on the contrary, when zeta-potential is close to 0, particles readily aggregate.

The opacifying agent included in the silica aerogel-including blanket of the present disclosure includes various surface functional group, specifically, condensation reactive functional groups on the surface due to an etching process, and resultantly exhibits average zeta-potential in the above-mentioned range. The average zeta-potential of the opacifying agent may be controlled through controlling strong base concentration and etching time during the etching process, and by the opacifying agent having average zeta-potential in the above-mentioned range, excellent dispersibility and dispersion stability may be exhibited in a reaction system for preparing a blanket. As a result, uniform dispersion with higher content is obtained on the surface of and inside the blanket when preparing the blanket, and excellent IR absorptivity may be exhibited over the whole blanket, and a significantly improved insulation property is obtained as well. When considering the significance of improvement effects obtained from controlling zeta-potential of the opacifying agent, the average zeta-potential of the opacifying agent in water may be more specifically from −30 mV to −60 mV and even more specifically from −50 mV to −60 mV.

In addition, as described above, the opacifying agent may have high reaction activity by forming a reactive functional group on the particle surface through strong base treatment in the preparation process. Specifically, inorganic particles forming the opacifying agent include condensation reactive functional groups capable of readily condensation reacting with a silica precursor on the particle surface. Specifically, the condensation reactive functional group may be a hydroxyl group (—OH), an alkoxy group (—ROH), a carboxyl group (—COOH), an ester group (—COOR) or the like, and any one, or two or more thereof may be included. Herein Rs in the alkoxy group and the ester group are each independently a hydrocarbon group such as an alkyl group having 1 to 20 carbon atoms, a cycloalkyl group having 3 to 20 carbon atoms, an aryl group having 6 to 20 carbon atoms, an arylalkyl group having 7 to 20 carbon atoms or an alkylaryl group having 7 to 20 carbon atoms.

By the condensation reactive functional group formed on the inorganic particle surface, a condensation reaction with a silica precursor readily occurs leading to chemical binding, and excellent binding force for the silica aerogel and the substrate for a blanket may be obtained in a finally prepared blanket including a silica aerogel, and as a result, content of the opacifying agent in the blanket increases, true density of the blanket increases, and an insulation property of the blanket may be more enhanced.

In addition, the opacifying agent may have a simpler structure and a smaller particle diameter compared to existing opacifying agents by the chemical etching process.

An opacifying agent is commonly a unit assembly, and has a second particulate with a plurality of inorganic particles of a first particulate being aggregated and structured. The structure of the opacifying agent may be defined as the number of particles of the unit assembly included in a unit volume or a weight per unit volume, and closely affects properties of the opacifying agent together with a particle diameter. When the structure of the opacifying agent develops, the surface area decreases, and when the structure less develops, density of the unit assembly increases and a distance between the unit assemblies decreases requiring strong dispersion energy.

In the opacifying agent used in the present disclosure, such structurization breaks through an etching process, and as a result, the number of particles of the unit assembly per unit volume decreases compared to existing opacifying agents leading to simple structurization. Specifically, the opacifying agent used in the present disclosure includes 1 to 5, more specifically 2 to 5 and even more specifically 3 to 5 inorganic particles per unit volume of 1 μm$^3$.

In addition, an average particle diameter ($D_{50}$) of the opacifying agent may be from 300 nm to 1600 nm under conditions satisfying the above-mentioned structured condition.

The average particle diameter of the opacifying agent being less than 300 nm may cause concern of dispersibility decline due to particle aggregation, and greater than 1600 nm may cause concern of dispersibility decline of itself. When considering dispersibility and dispersion stability improvement effects caused by controlling an average particle diameter of the opacifying agent, the opacifying agent may have an average particle diameter ($D_{50}$) of 300 nm to 600 nm.

In the present disclosure, the average particle diameter ($D_{50}$) of the opacifying agent may be defined as a particle diameter based on 50% in the particle diameter distribution. In the present disclosure, the average particle diameter ($D_{50}$) of the opacifying agent may be measured by, for example, observation with an electron microscope using a scanning electron microscope (SEM), a field emission scanning electron microscope (FE-SEM) or the like, or measured using a laser diffraction method. More specifically, when measured using a laser diffraction method, the opacifying agent is dispersed into a dispersion medium and then introduced to a commercially available laser diffraction particle size measuring instrument (for example, Microtrac MT 3000), and after irradiating ultrasonic waves of approximately 28 kHz with an output of 60 W, the average particle diameter ($D_{50}$) based on 50% in the particle diameter distribution in the measuring instrument may be calculated.

In addition, the inorganic particles of a first particulate forming the opacifying agent may have an average particle diameter ($D_{50}$) of 50 nm to 1000 nm under the condition satisfying the ranges in the number of the first particles per unit volume and the average particle size of the opacifying agent described above. The average particle diameter of the first particles being less than 50 nm may cause concern of dispersibility decline due to aggregation between particles, and the average particle diameter of the first particles being greater than 1000 nm may cause concern of decline in the reactivity with a silica network due to low particle surface activity. More specifically, the inorganic particles of a first particulate may have an average particle diameter of 100 nm to 300 nm.

Meanwhile, in the present disclosure, the average particle diameter ($D_{50}$) of the inorganic particles of a first particulate may be defined as a particle diameter based on 50% in the particle diameter distribution as defined above, and after observing with an electronic microscope such as TEM for the inorganic particles, the average particle diameter may be calculated from the result.

By the above-mentioned etching process, the inorganic particles of a first particulate may include unevenness formed on the first particle surface while simplifying the structure forming a second particulate. The unevenness on the first particle surface may be identified using common particle surface observation method, and specifically, may be observed through a scanning electron microscope and the like.

In addition, the opacifying agent includes inorganic particles, and therefore, may enhance flame retardancy of a silica aerogel-containing insulation material.

Specific examples of the inorganic particles may include metal oxides such as silica ($SiO_2$), alumina ($Al_2O_3$), titania ($TiO_2$), zirconia ($ZrO_2$), tin oxide ($SnO_2$), zinc oxide (ZnO) or iron oxide; metal carbides such as beryllium carbide ($Be_2C$), titanium carbide (TiC) or silicon carbide (SiC); metal nitrides such as vanadium nitride (VN), titanium nitride (TiN), molybdenum nitride ($Mo_2N$), tungsten nitride (WN), niobium nitride (NbN), titanium nitride (TiN) or boron nitride (BN); metal hydroxides such as magnesium hydroxide ($Mg(OH)_2$)) or aluminum hydroxide ($Al(OH)_3$); metal salts such as calcium carbonate ($CaCO_3$); silicate compounds such as tricalcium silicate ($Ca_3SiO_5$), dicalcium silicate ($Ca_2SiO_4$) or calcium metasilicate ($CaSiO_3$); graphite such as natural graphite or artificial graphite; carbon-based materials such as carbon black, acetylene black, ketjen black, channel black, furnace black, lamp black, thermal black or carbon fiber; ceramic particles such as yttria stabilized zirconia (YSZ), calcia stabilized zirconia (CSZ), scandia stabilized zirconia (SSZ) or nickel-yttria stabilized zirconia cermet (Ni—YSZ cermet); pigments containing metals such as iron or manganese, and any one or a mixture of two or more thereof may be used.

Depending on the use of the blanket including a silica aerogel, the inorganic particles may be properly selected and used among the inorganic particles illustrated above.

Specifically, in the blanket for a high temperature having a used temperature range of 0° C. to 600° C., and a highest usable temperature of 650° C., metal oxides such as titania or iron oxide; metal hydroxides such as aluminum hydroxide (Al(OH)$_3$); pigments containing iron and manganese, and the like, may be used as the inorganic particles, and more specifically, titania (TiO$_2$) exhibiting excellent IR wavelength absorptivity at high temperatures may be used. The TiO$_2$ may have a rutile-type crystal structure, an anatase-type crystal structure or a mixed crystal structure thereof, and among these, may have a rutile-type crystal structure having more superior IR absorptivity.

In the blanket for a low temperature having a used temperature range of −200° C. to 150° C., and a lowest usable temperature of −200° C. and a highest usable temperature of 200° C., metal hydroxides such as magnesium hydroxide (Mg(OH)$_2$)) or aluminum hydroxide (Al(OH)$_3$) may be used as the inorganic particles, and more specifically, magnesium hydroxide may be used.

In the blanket for room temperature having a used temperature range of −50° C. to 200° C., and a highest usable temperature of 200° C., graphite, carbon-based materials, silicate compounds, or mixtures thereof may be used as the inorganic particles.

The opacifying agent may be included in 10% by weight to 70% by weight with respect to the total weight of the blanket including a silica aerogel. When the content of the opacifying agent is less than 10% by weight, effects obtained from using the opacifying agent is insignificant, and the content being greater than 70% by weight may cause concern of performance decline as an insulation material.

Meanwhile, in the silica aerogel-including blanket according to one embodiment of the present disclosure, the silica aerogel is a particulate porous structure including a plurality of micropores, and may have a microstructure forming a mesh-type cluster by the bindings of nano-sized first particles, specifically, first particles having an average particle diameter (D$_{50}$) of 100 nm or less and more specifically 10 nm to 50 nm, that is, a three-dimensional network structure.

In such a porous structure of the silica aerogel, sizes and density of the pores may be controlled through controlling conditions in the preparing process. Specifically, the silica aerogel may have porosity of 90% or higher, and tap density of 0.04 g/cm$^3$ to 0.5 g/cm$^3$. In addition, the average pore diameter may be 20 nm or less or from 5 nm to 15 nm.

In the present disclosure, the tap density of the silica aerogel may be measured using a tap density measuring instrument (TAP-2S, Logan Instruments Co.), and the average pore diameter and the porosity may be measured as adsorbed/desorbed amounts of nitrogen depending on a partial pressure (0.11<p/p$_o$<1) using an ASAP 2010 instrument of Micrometrics.

In addition, the silica aerogel preferably has an average particle diameter or a specific surface area readily penetrable or attachable into the pores of a substrate for a blanket used when preparing the blanket. Specifically, the silica aerogel may have a specific surface area of 700 m$^2$/g or greater, and more specifically 700 m$^2$/g to 1000 m$^2$/g. When satisfying the specific surface area condition together with the tap density, effects of low thermal conductivity and enhanced insulation may be obtained due to the volume occupied by the pores. In addition, the silica aerogel may have an average particle diameter (D$_{50}$) of 10 μm to 80 μm and more specifically 10 μm to 20 μm.

In the present disclosure, the specific surface area of the silica aerogel may be measured as adsorbed/desorbed amounts of nitrogen depending on a partial pressure (0.11<p/p$_o$<1) using an ASAP 2010 instrument of Micrometrics. In addition, the average particle diameter (D$_{50}$) may be defined as a particle diameter based on 50% in the particle diameter distribution, and herein, the average particle diameter of the silica aerogel may be measured using a laser diffraction method, and more specifically, the hydrophobic silica aerogel is dispersed into a solvent and then introduced to a commercially available laser diffraction particle size measuring instrument (for example, Microtrac MT 3000), and after irradiating ultrasonic waves of approximately 28 kHz with an output of 60 W, the average particle diameter (D$_{50}$) based on 50% in the particle diameter distribution in the measuring instrument may be calculated.

The hydrophobic aerogel having lower thermal conductivity than the substrate for a blanket may increase an insulation effect when preparing the blanket. Specifically, the silica aerogel may have thermal conductivity of 20 mW/mK or less.

In addition, the silica aerogel is surface hydrophobized. Silica aerogels normally maintain low thermal conductivity immediately after preparation, however, as a hydrophobic silanol group (Si—OH) present on the silica surface absorbs moisture in air, thermal conductivity gradually increases. Accordingly, in order to maintain low thermal conductivity, the silica aerogel surface needs to be modified to be hydrophobic. In common hydrophobic aerogels, hydrophobicity or the degree of hydrophobicity may be identified as the content of carbon included in the hydrophobic aerogel, and in the present disclosure, the silica aerogel may specifically have carbon content of 8% by weight or greater or 8.5% by weight to 12% by weight with respect to the total weight of the silica aerogel at room temperature (23±5° C.)

Such a silica aerogel may be included in 20% by weight to 80% by weight with respect to the total weight of the blanket including a silica aerogel. As the silica aerogel content increases in the blanket, an insulation property is enhanced, however, when the content is greater than 80% by weight, strength and adhesiveness may decrease when preparing the blanket thereafter due to low strength and adhesiveness of the silica aerogel itself. In addition, when the silica aerogel content in the blanket is excessively low, specifically, less than 20% by weight, an insulation property may decline.

Meanwhile, in the blanket including a silica aerogel, the substrate for a blanket may be a fiber, a film, a sheet, a net, a textile, a porous body, a foam, a non-woven fabric or a laminate of two or more layers thereof. In addition, depending on the use, the surface may have micro-unevenness formed thereon or may be patterned. More specifically, the substrate for a blanket may be a textile capable of more enhancing insulation performance by including space or pores readily allowing insertion of the hydrophobic aerogel into the substrate for a blanket.

Specifically, the substrate for a blanket may be polyamide, polybenzimidazole, polyaramide, an acrylic resin, a phenol resin, polyester, polyetheretherketone (PEEK), polyolefin (for example, polyethylene, polypropylene, a copolymer thereof, or the like), cellulose, carbon, cotton, wool, hemp, non-woven fabric, glass fiber, ceramic wool or the like, but is not limited thereto. More specifically, the substrate may include any one or two or more selected from the group consisting of glass fiber, polyethylene and polyester.

In addition, the substrate for a blanket may have low thermal conductivity, specifically, thermally conductivity of 20 mW/mk or less and more specifically 15 mW/mk to 20 mW/mk.

The substrate for a blanket may be surface hydrophobized, and accordingly, may further include a surface hydrophobization layer on at least one surface of the substrate for a blanket.

Hydrophobization of the substrate for a blanket may be carried out using common methods, and specifically, may be carried out by surface treating the substrate for a blanket using compounds including a hydrophobic functional group such as a chain-shaped hydrocarbon group, an aromatic hydrocarbon group, a halogenated alkyl group, an organosilicon compound, an alkyl group, a vinyl group, an allyl group, an aryl group or a phenyl group.

The substrate for a blanket preferably has low density, and specifically, when the substrate is a textile, fibers forming the textile may have an average fiber diameter of 10 μm to 30 μm. Having such low density facilitates the introduction of the silica aerogel and the opacifying agent into the substrate for a blanket increasing the content of the silica aerogel and the opacifying agent and thereby enhancing an insulation property, and in addition thereto, flexibility of a finally prepared silica aerogel-including blanket may increase.

In addition, on a part or throughout the substrate for a blanket, functional layers such as a heat reflecting layer for enhancing insulation performance or a surface protective layer capable of enhancing a lifespan property through surface protection may be further formed.

As one example, the heat reflecting layer includes compounds capable of reflecting or blocking infrared radiation, and specifically, may include carbon black, carbon fiber, titanium dioxide, metals (aluminum, stainless steel, copper/zinc alloys, copper/chromium alloys or the like), non-metals, fibers, pigments and the like. The surface protective layer may include high heat resistance waterproof and breathable materials such as polytetrafluoroethylene.

Lamination of the functional layers may be carried out by directly forming the functional layers on at least one surface of the insulation blanket, or placing the functional layers and laminating the result. The lamination process may be carried out using common methods such as heat treatment or hot rolling treatment.

The silica aerogel-including blanket according to one embodiment of the present disclosure having such a constitution and structure may be prepared using a method including preparing an opacifying agent-including dispersion liquid by dispersing inorganic particles into an aqueous basic solution and etching the particles, and then adding water thereto (Step 1); preparing an opacifying agent-including composition for forming a silica aerogel by mixing the opacifying agent-including dispersion liquid with a silica precursor (Step 2); preparing an opacifying agent-silica gel-substrate complex by adding a base catalyst and a polar organic solvent to the opacifying agent-including composition for forming a silica aerogel, and then adding a substrate for a blanket thereto and gelling the result (Step 3); and surface hydrophobizing the opacifying agent-silica gel-substrate complex and then drying the result (Step 4). Accordingly, another embodiment of the present disclosure provides a method for preparing the blanket including a silica aerogel.

Hereinafter, each step will be described. Step 1 for preparing the silica aerogel-including blanket according to one embodiment of the present disclosure is a step of preparing an opacifying agent-including dispersion liquid.

Specifically, the opacifying agent-including dispersion liquid may be prepared by dispersing inorganic particles into an aqueous basic solution and etching the particles, and then adding water to the resulting etched inorganic particles.

Herein, a chemical etching reaction occurs for the inorganic particles, and the inorganic particles are as described above.

Chemical etching for inorganic particles only occurs by a strong base, and as the strong base capable of being used in preparing the opacifying agent-including dispersion liquid, basic materials having a high acid dissociation constant, specifically, having an acid dissociation constant (pKa) of 12 or greater and more specifically 13.5 or higher under a condition of 25° C. and an aqueous solution of 0.1M concentration may be used. More specifically, sodium hydroxide, potassium hydroxide, calcium hydroxide, barium hydroxide or the like may be used as the strong base, and any one or a mixture of two or more thereof may be used.

Specifically, the aqueous basic solution is prepared by dissolving the strong base in water, and when considering etching efficiency and processibility, may include the strong base in a concentration of 0.1M to 10M. When the aqueous basic solution has a concentration of less than 0.1M, an opacifying agent having physical properties as described above may not be readily prepared due to low etching efficiency for the inorganic particles, and when the concentration is greater than 10M, the etching reaction may not be readily controlled, and formation of the silica aerogel may be affected since a pH of the opacifying agent-containing dispersion liquid increases.

The etching reaction for the inorganic particles may be controlled depending on the concentration of the used strong based and time of the etching process. In the present disclosure, the concentration of the base and the time may be properly determined so as to prepare an opacifying agent having the above-mentioned zeta-potential and physical properties such as particle sizes. When using the aqueous basic solution, the etching time may be properly controlled.

After the etching process is complete, the etchant is removed and water is added thereto. Herein, the water functions as both a diluting solvent for the base material used in the etching and a dispersion medium for the inorganic particles in the opacifying agent-including dispersion liquid, and moreover, may function as an etching efficiency enhancer for the inorganic particles.

Alcohol-based solvents such as aliphatic glycol used in preparing existing silica aerogel-containing blankets may also be used, however, such aliphatic glycol only performs a role of a dispersion agent increasing dispersibility of the inorganic particles by being simply surface coated on the inorganic particle surface making the inorganic particle surface hydrophilic, and does not provide an effect of enhancing etching efficiency for the inorganic particles since ionization does not readily occur. On the contrary, the water used in the present disclosure is readily ionized, and therefore, etching efficiency of the strong base for the inorganic particles may increase, and as a result, sizes of the inorganic particles are readily controlled. The water also increases inorganic particle surface activity, and is capable of increasing condensation reaction efficiency with a silica precursor.

Herein, the water may be used in an amount to make the opacifying agent content in the dispersion liquid 0.1 g/100 ml to 3 g/100 ml and more specifically 0.4 g/100 ml to 2 g/100 ml.

In addition, a dispersion process for uniformly dispersing the inorganic particles in the aqueous solution may be further carried out when preparing the opacifying agent-including dispersion liquid, and herein, the dispersion process may be carried out using common dispersion methods such as stirring.

Step 2 for preparing the silica aerogel-including blanket according to one embodiment of the present disclosure is a step of preparing an opacifying agent-including composition for forming a silica aerogel by mixing the opacifying agent-including dispersion liquid prepared in Step 1 with a silica precursor.

The silica precursor may specifically be silica alkoxide or water glass. The silica precursor may be added in a liquid state dissolved in a solvent.

The water glass may be used in a diluted solution prepared by adding water, specifically, distilled water, to water glass and mixing the result. In the water glass solution, the water glass is not particularly limited, but specifically, may contain 28% by weight to 35% by weight of silica ($SiO_2$), and the diluted water glass solution diluted by adding water to the water glass may contain 0.1% by weight to 30% by weight of silica.

In addition, the solvent may be a solvent capable of dissolving the silica precursor, and specifically, water or a polar organic solvent, and any one or a mixture of two or more thereof may be included. The polar organic solvent may be an alcohol such as ethanol.

The opacifying agent-including dispersion liquid and the precursor-including solution may be mixed in a proper mixing ratio considering the content of the opacifying agent and the silica aerogel in a finally prepared blanket, and the content of the opacifying agent and the silica aerogel in the blanket is as described above.

As a result of the above process, the opacifying agent-including composition for forming a silica aerogel may be formed.

Step 3 for preparing the silica aerogel-including blanket according to one embodiment of the present disclosure is a step of preparing an opacifying agent-silica gel-substrate complex by adding a base catalyst and a polar organic solvent to the opacifying agent-including composition for forming a silica aerogel, and then adding a substrate for a blanket thereto and gelling the result.

The base catalyst performs a role of facilitating gelation by increasing a PH in a reaction system, that is, the opacifying agent-including composition for forming a silica aerogel, and specifically, may be ammonia or the like.

The polar organic solvent may have excellent miscibility with the silica precursor, and after that, may be uniformly present in the gel during gelation. As a result, a solvent exchange step may not be included when preparing the opacifying agent-silica gel-substrate complex thereafter.

Specifically, the polar organic solvent may be an alcohol-based solvent, and specific examples of the alcohol-based solvent may include primary alcohols such as methanol, ethanol, isopropanol or butanol; or polyalcohols such as glycerol, ethylene glycol, propylene glycol, diethylene glycol, dipropylene glycol and sorbitol, and any one or a mixture of two or more thereof may be used. When considering miscibility with other and uniform dispersibility in the silica gel, the alcohol-based compound may be an alcohol having 1 to 8 carbon atoms among these. When also considering efficiency of a modification reaction for the silica surface carried out thereafter together with the abovementioned effects, the alcohol-based compound may be a linear alcohol having 1 to 4 carbon atoms such as methanol, ethanol, propanol or n-butanol, and the compound may be used as either one type alone or as a mixture of two or more types. Even more specifically, the alcohol-based compound may be methanol, ethanol or a mixture thereof.

The base catalyst and the polar organic solvent may be each added, or added in a solution state dissolving the base catalyst in the polar organic solvent. Herein, the polar organic solvent may be used in an amount of 5 parts by weight to 20 parts by weight, more specifically in 5 parts by weight to 16 parts by weight and even more specifically in 7 parts by weight to 10 parts by weight with respect to 1 part by weight of the silica. In addition, the base catalyst and the base catalyst-containing solution may be added in an amount to make the pH of the opacifying agent-including composition for forming a silica aerogel 8 to 14, and more specifically 8 to 9.

Such a base catalyst and a polar organic solvent are added to the opacifying agent-including composition for forming a silica aerogel to prepare a mixed solution, and the substrate for a blanket is immersed or casted in the prepared mixed solution to induce gelation, and as a result, an opacifying agent-silica gel-substrate complex is prepared. Herein, the substrate for a blanket may be the same as described above.

Next, Step 4 for preparing the silica aerogel-including blanket according to one embodiment of the present disclosure is a step of preparing the silica aerogel-including blanket by surface hydrophobizing the opacifying agent-silica gel-substrate complex prepared in Step 3 and then drying the result.

Herein, an aging process may be selectively further carried out prior to the surface modification of hydrophobization.

The aging process is a process for completely accomplishing chemical changes by leaving the opacifying agent-silica gel-substrate complex unattended at a proper temperature, and may strengthen a network structure inside the silica gel through the aging process for the opacifying agent-silica gel-substrate complex. In addition, moisture inside the silica gel may be replaced by the polar organic solvent during the aging, and as a result, pore structure deformation and decrease in the silica gel caused by moisture evaporation inside the silica gel may be prevented in the following drying process.

Specifically, the aging process may be carried out by maintaining the opacifying agent-silica gel-substrate complex in water, a polar organic solvent or a mixed solvent thereof under a temperature of 25° C. to 80° C. and more specifically 50° C. to 80° C. Herein, types of the polar organic solvent are the same as described above. However, the water, the polar organic solvent or a mixed solvent thereof may be used in an amount corresponding to a volume of 1 to 3 times with respect to the volume of the opacifying agent-silica gel-substrate complex.

Herein, a base may be further added for facilitating the reaction. The base may be the same as described above, and may be mixed with the polar organic solvent to be added. Specifically, the base may be added in the content of 20 parts by weight or less and more specifically 1 part by weight to 15 parts by weight with respect to 100 parts by weight of the solvent added during the aging process.

The aging process may be carried out until chemical changes in the opacifying agent-silica gel-substrate complex are complete, and specifically, may be carried out for 1 hour to 6 hours or for 1 hour to 2 hours.

Meanwhile, the surface modification of hydrophobization may be carried out using any one of surface modifiers such as silane-based compounds (for example, dimethyl dimethoxysilane, dimethyl diethoxysilane, methyl trimethoxysilane, vinyl trimethoxysilane, phenyl trimethoxysilane, tetraethoxysilane, dimethyl dichlorosilane, 3-aminopropyl triethoxysilane or the like), siloxane-based compounds (for example, polydimethylsiloxane, polydiethylsiloxane, octamethylcyclotetrasiloxane or the like), silanol-based compounds (for example, trimethylsilanol, triethylsilanol, triphenylsilanol, t-butyldimethylsilanol or the like), or silazane-based compounds (for example, 1,2-diethyldisilazane, 1,1,2,2-tetramethyldisilazane, 1,1,3,3-tetramethyldisilazane, 1,1,1,2,2,2-hexamethyldisilazane (HMDS), 1,1,2,2-tetraethyldisilazane, 1,2-diisopropyldisilazane or the like), or a mixture of two or more thereof.

Among these, the surface modifier may be a silazane-based compound including two or more alkyl groups in one molecule, and more specifically, may be a compound of the following Chemical Formula 1:

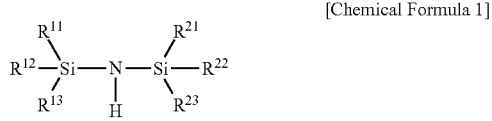

[Chemical Formula 1]

In Chemical Formula 1, $R^{11}$ to $R^{13}$ and $R^{21}$ to $R^{23}$ are each independently a hydrogen atom or an alkyl group having 1 to 8 carbon atoms, however, $R^{11}$ to $R^{13}$ and $R^{21}$ to $R^{23}$ are not hydrogen atoms at the same time.

The silazane-based surface modifier may be decomposed when used together with an alcohol-based compound to produce two molecules of alkoxysilane-based compound. The produced alkoxysilane-based compound may further increase the degree of hydrophobicity when surface modifying the silica aerogel by including a maximum of three alkyl groups in one molecule. Accordingly, the amount of the surface modifier used for hydrophobizing the silica aerogel may be minimized.

Specific examples of the silazane-based compound may include diethyldisilazane, tetramethyldisilazane, hexamethyldisilazane, tetraethyldisilazane, diisopropyldisilazane or the like, and any one or a mixture of two or more thereof may be used.

Among these, the silazane-based surface modifier may be tetraalkyldisilazane including four alkyl groups having 1 to 4 atoms together with two hydrogen atoms or hexaalkyldisilazane including six alkyl groups having 1 to 4 atoms in the silazane-based compound of Chemical Formula 1 in order to further increase hydrophobicity of the silica aerogel, and more specifically, may be hexamethyldisilazane (HMDS) or tetramethyldisilazane.

The surface modifier may be used in 0.6 parts by weight to 2 parts by weight with respect to 1 part by weight of the silica included in the sol. When the surface modifier content is less than 0.6 parts by weight, the degree of hydrophobicity is low in a finally prepared silica aerogel, and tap density may increase, and when the content is greater than 2 parts by weight, effects of enhancing a tap density property and the degree of hydrophobicity property may be insignificant considering the amount added. When considering the significance of improvement effects obtained from the use of the surface modifier, the surface modifier may be used in 0.6 parts by weight to 1.8 parts by weight or 0.6 parts by weight to 1.2 parts by weight with respect to 1 part by weight of the silica.

The drying process may specifically be carried out by a supercritical drying process using supercritical carbon dioxide or an atmospheric drying process.

Carbon dioxide ($CO_2$) is in a gaseous state at room temperature and atmospheric pressure, but, when exceeding the limit of certain temperature and high pressure called a supercritical point, is in the critical state in which gas and liquid are not distinguished since no evaporation occurs, and carbon dioxide in this critical state is referred to as supercritical carbon dioxide. Supercritical carbon dioxide is close to a liquid in terms of molecular density, has a property close to a gas due to low viscosity, and has high drying efficiency with fast diffusion and high thermal conductivity, and is capable of shortening drying process time.

The supercritical drying process may be carried out using common methods except that the silica gel-substrate complex prepared in Step 2 is used. Specifically, the supercritical drying process carries out a solvent exchange process in which the silica gel-substrate complex is placed in a supercritical drying reactor, and then the reactor is filled with $CO_2$ in a liquid state, and the alcohol solvent inside the silica aerogel is replaced by $CO_2$. After that, the temperature was raised to 40° C. to 50° C. at a constant temperature raising rate, specifically at a rate of 0.1° C./min to 1° C./min, and then maintained for a certain period of time, specifically for 20 minutes to 1 hour, in a supercritical state of carbon dioxide by maintaining the pressure at higher than a pressure at which carbon dioxide becomes a supercritical state, and specifically at a pressure of 100 bar to 150 bar. Generally, carbon dioxide becomes a supercritical state at a temperature of 31° C. and a pressure of 73.8 bar. After maintaining at a certain temperature and a certain pressure at which carbon dioxide becomes a supercritical state for 2 hours to 12 hours and more specifically for 2 hours to 6 hours, the supercritical drying process may be completed by slowly relieving the pressure.

The atmospheric drying process may be carried out using common methods such as natural drying under atmospheric pressure (1±0.3 atm), and selectively, heat treatment of one hour or shorter may be carried out at 120° C. to 180° C. under the above-mentioned pressure condition. Herein, in order to prevent the aerogel structure shrinkage caused by rapid drying of the residual solvent in the prepared blanket, the blanket may be covered with metal foil such as aluminum foil, and the process may be carried out after poking a plurality of holes.

As a result of such a drying process, a blanket including a porous silica aerogel having nano-sized pores may be prepared.

The silica aerogel-including blanket prepared using such a preparation method is capable of exhibiting enhanced flame retardancy as well as low thermal conductivity by including the opacifying agent of inorganic particles having excellent IR absorptivity uniformly dispersed in the blanket. Accordingly, the blanket is useful as an insulation material, a lagging material or an incombustible material in aircrafts, vessels, automobiles, construction structures and the like as well as in plant facilities for heating and cooling such as pipes for various industrial equipment or industrial furnaces.

Moreover, still another embodiment of the present disclosure provides an opacifying agent-including dispersion liquid useful for preparing the blanket including a silica aerogel.

As described above, the opacifying agent-including dispersion liquid is prepared by dispersing inorganic particles into an aqueous basic solution including a strong base and etching the particles, and then purifying with water, and may include water and an opacifying agent having the above-mentioned physical properties as a result of chemical etching. Herein, types and content of the opacifying agent, and a method for preparing the opacifying agent-including dispersion liquid are the same as described above.

Hereinafter, the present disclosure will be described in more detail with reference to the following examples and test examples. However, the following examples and test examples are for illustrative purposes only, and the scope of the present disclosure is not limited to these examples and test examples.

Example 1

5 g of $TiO_2$ having rutile-type crystallinity was placed in a 2M potassium hydroxide (KOH) solution, and the result was stirred for 3 hours to carry out an etching reaction for the $TiO_2$. 240 ml of water was added to the resultant etchant, and the result was purified to prepare an opacifying agent-including dispersion liquid in which the etched $TiO_2$ was dispersed into water.

To a precursor solution prepared by mixing 20 g of a silica alkoxide precursor and 40 g of ethanol, 5 ml of the opacifying agent-including dispersion liquid prepared above was added to prepare an opacifying agent-including composition for forming a silica aerogel.

A solution diluting 0.5 ml of an ammonia catalyst in 12 ml of ethanol was added to the opacifying agent-including composition for forming a silica aerogel so that the pH of the composition becomes 8 to 9, and the result was casted on a polyethylene terephthalate (PET) fiber to induce gelation. After completing the gelation, the opacifying agent-silica gel-substrate complex obtained as a result was aged for 70 minutes at 50° C. using 2.0% by weight of an aqueous ammonia solution. After completing the aging, surface modification of hydrophobization was carried out for the resultant opacifying agent-silica gel-substrate complex for 12 hours using 80 ml of a surface modifier-containing solution prepared by mixing 4 ml of hexamethyldisilazane (HMDS) and 76 ml of ethanol. After completing the reaction of the surface modification of hydrophobization, the resultantly obtained wet gel was dried under an atmospheric pressure (1 atm), and a blanket including the silica aerogel and the opacifying agent of the etched $TiO_2$ was prepared

Example 2

A blanket was prepared in the same manner as in Example 1 except that a PET fiber surface hydrophobized with hexamethyldisilazane (HMDS) was used instead of the polyethylene terephthalate (PET) fiber.

Comparative Example 1

To a precursor solution prepared by mixing 20 g of a silica alkoxide precursor and 40 g of ethanol, 5 ml of a dispersion liquid prepared by dispersing 5 g $TiO_2$ of having rutile-type crystallinity as an opacifying agent into 240 ml of distilled water was added to prepare an opacifying agent-including composition for forming a silica aerogel. A solution diluting 0.5 ml of an ammonia catalyst in 12 ml of ethanol was added to the opacifying agent-including composition for forming a silica aerogel so that the pH of the composition becomes 8 to 9, and the result was casted on a PET fiber to induce gelation. After completing the gelation, the opacifying agent-silica gel-substrate complex obtained as a result was aged for 70 minutes at 50° C. using 2.0% by weight of an aqueous ammonia solution. After completing the aging, surface modification of hydrophobization was carried out for the resultant opacifying agent-silica gel-substrate complex for 12 hours using 80 ml of a surface modifier-containing solution prepared by mixing 4 ml of hexamethyldisilazane (HMDS) and 76 ml of ethanol. After completing the reaction of the surface modification of hydrophobization, the resultantly obtained wet gel was dried under an atmospheric pressure (1 atm), and a blanket including the silica aerogel and the opacifying agent was prepared.

Test Example 1

Figure 2:
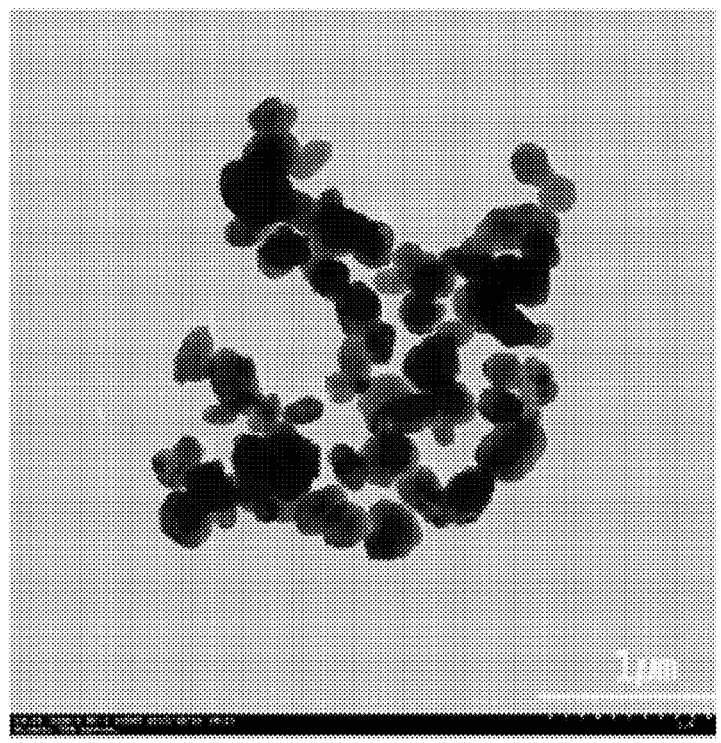
FIG. 2 is a TEM picture observing an opacifying agent prepared in Comparative Example 1.

The opacifying agents prepared in Example 1 and Comparative Example 1 were observed using a transmission electron microscope. The results are each shown in FIG. 1 and FIG. 2.

As a result of the observation, it was identified that, in the opacifying agent prepared in Example 1, an average of 4 inorganic particles of a first particulate were bound in the unit volume, whereas, in the opacifying agent of Comparative Example 1 without an etching process, approximately 20 to 30 and an average of 25 inorganic particles of a first particulate were bound in the unit volume, which is highly structured.

In addition, the opacifying agent prepared in Example 1 had an average particle diameter ($D_{50}$) of 320 nm, and an average particle diameter ($D_{50}$) of the inorganic particles of a first particulate forming the opacifying agent was 100 nm, and it was identified that micro-unevenness was formed on the surfaces of the inorganic particles of a first particulate.

In addition, the blankets prepared in Examples 1 and were pulverized under a condition of 6000 rpm using a milling apparatus, and then observed using a transmission electron microscope. The results are shown in FIG. 3 and FIG. 4.

Figure 3:
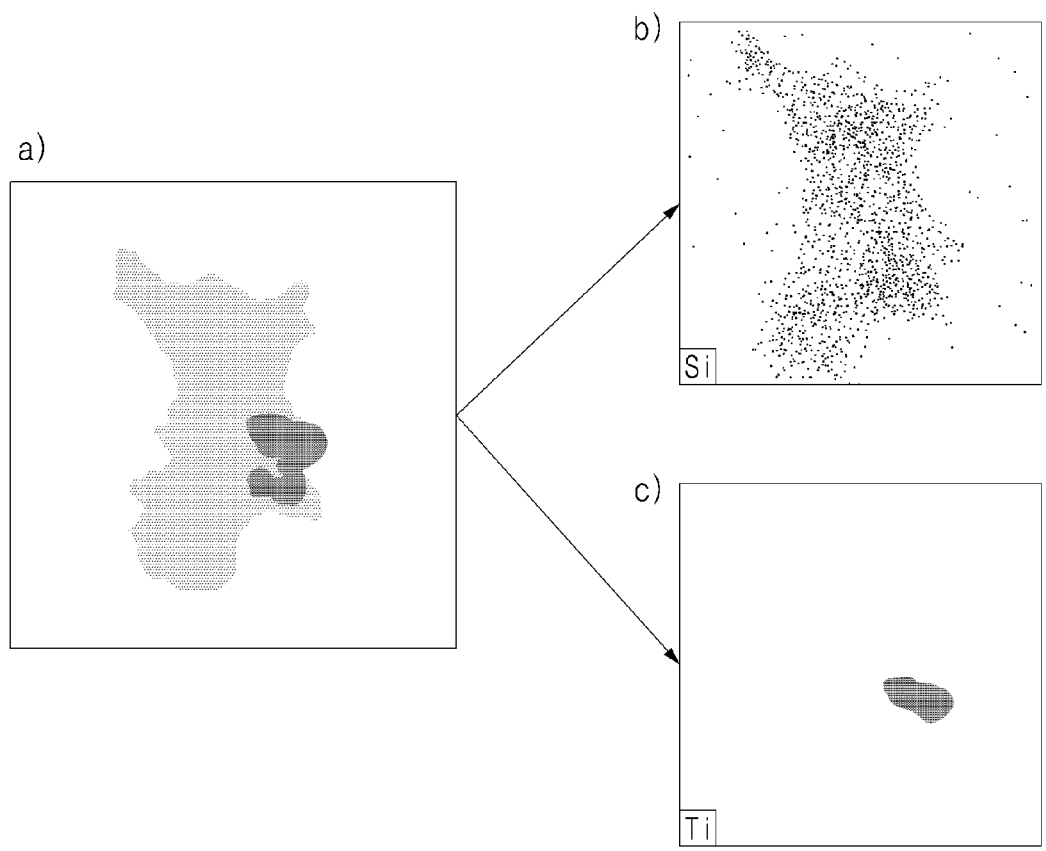
FIG. 3 is a TEM picture observing a silica aerogel-including blanket prepared in Example 1.
Figure 4:
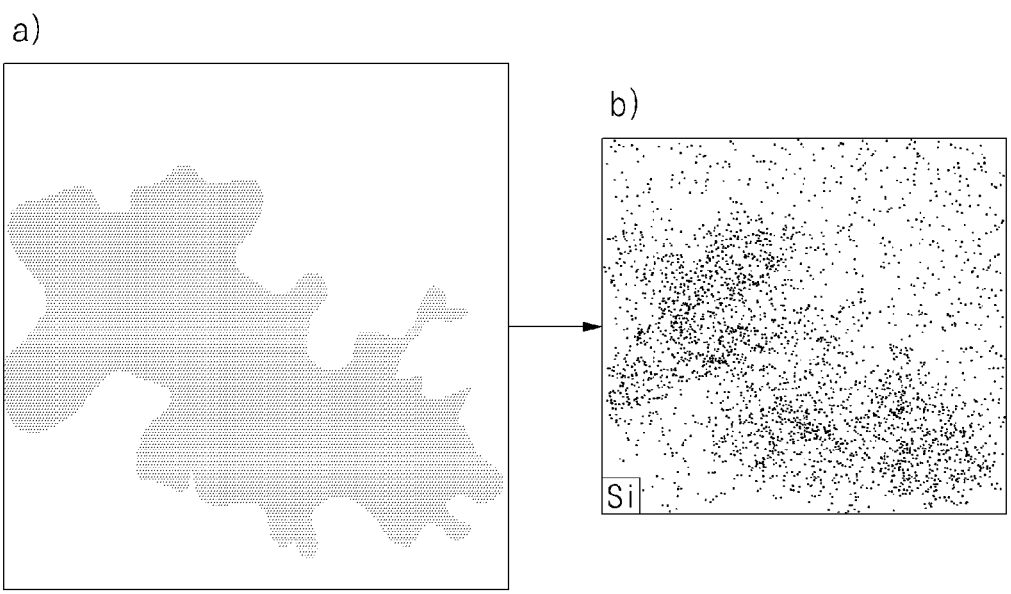
FIG. 4 is a TEM picture observing a silica aerogel-including blanket prepared in Comparative Example 1.

In FIG. 3, a) is a TEM picture observing a complex of the aerogel and the opacifying agent in the blanket, and b) observes the silicon (Si) in the complex, and c) observes the titanium (Ti) location therein. In FIG. 4, a) is a TEM picture observing the aerogel and the opacifying agent in the blanket, and b) is a picture observing silicon (Si) distribution in the blanket.

As a result of the observation, it was identified that, in Example 1, a condensation reactive functional group, specifically, a hydroxyl group, was formed in large quantities on the opacifying agent surface due to the etching process, and the opacifying agent was well introduced into the aerogel due to enhancement in the binding force with the silica precursor by the increased condensation reactive functional groups. In addition, the aerogels included in the blanket were linked to each other to form a three-dimensional network structure.

Meanwhile, in the blanket of Comparative Example 1 including the opacifying agent without an etching process, the opacifying agent had large particle sizes and less functional groups on the surface, and was readily separated from the aerogel during the milling process. As a result, Ti was hardly observed during TEM observation.

Test Example 2

Changes in the average particle diameter and the average zeta-potential depending on the amount of a base material used when etching the opacifying agent were observed.

Figure 5:
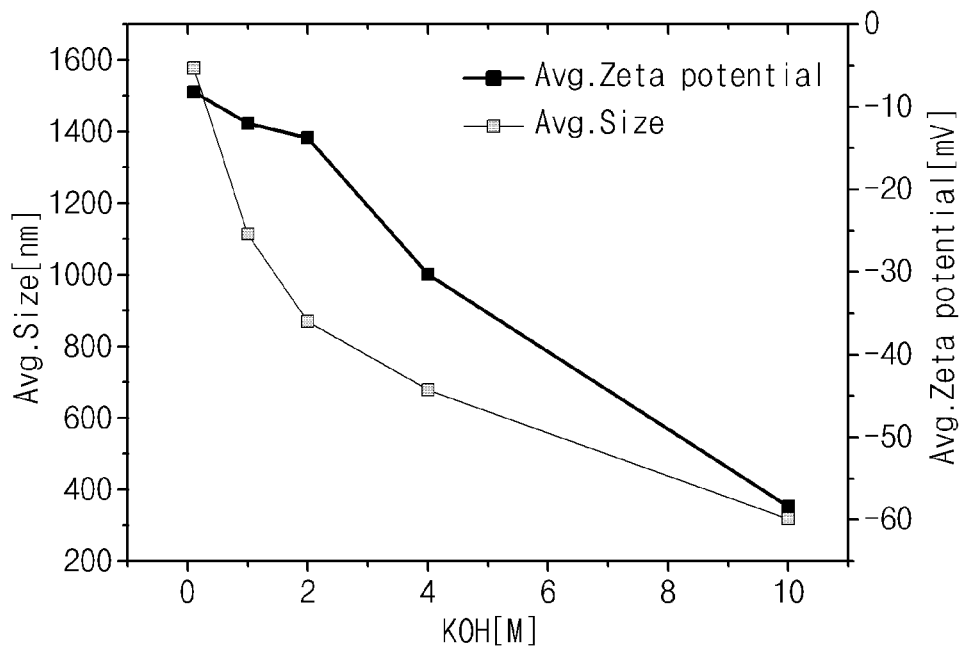
FIG. 5 is a graph observing changes in the average particle diameter and the average zeta-potential of an opacifying agent depending on KOH content when preparing the opacifying agent.

In detail, to each of potassium hydroxide solutions prepared while diversely varying the concentration of KOH to 0.1 M, 1 M, 2 M, 4 M and 10 M employed as a base material, 2 g of $TiO_2$ having rutile-type crystallinity was introduced, and the result was stirred for 2 hours at 25° C. to carry out an etching reaction for the $TiO_2$. 240 ml of water was added to the resultant etchant, and the result was purified to prepare an opacifying agent-including dispersion liquid in which the etched $TiO_2$ was dispersed into water. Using a zeta-potential measuring instrument (Zetasizer Nano ZS90, prepared by Malvern Instruments, Ltd.), an average particle diameter (avg. size) and average zeta-potential (avg. zeta-potential) of the $TiO_2$ dispersed into the dispersion liquid obtained above were measured. The results are shown in FIG. 5.

As a result of the test, the absolute value of the zeta-potential of the opacifying agent increased and the particle sizes decreased as the KOH concentration increased. Moreover, when considering that etching for inorganic particles are affected by etching time as well as base material concentration, it may be expected that the zeta-potential and the particle sizes of the opacifying agent may be controlled through controlling base material concentration and etching time.

In addition, particle size distribution of the opacifying agent depending on the etching was compared and evaluated.

Figure 6:
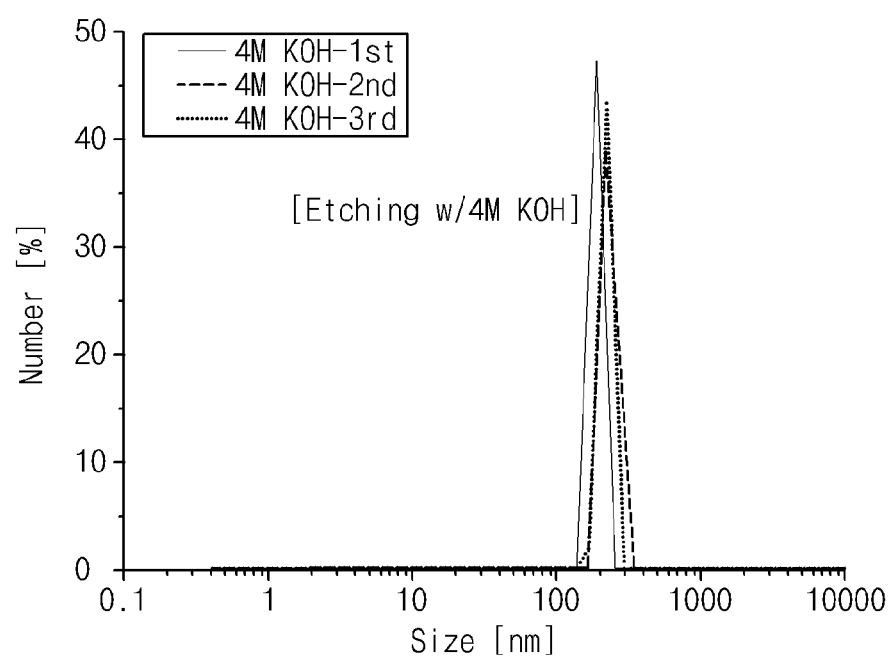
FIG. 6 is a graph observing particle size distribution of an opacifying agent depending on etching in Test Example 2.

In detail, the etching process was carried out once to three times in the same manner as above except that 4 M KOH was used as the base material, and particle size distribution of the obtained opacifying agent was observed depending on the number of etching. For comparison, particle size distribution was also observed for the opacifying agent of Comparative Example 1 that did not carry out the etching process. The results are shown in FIG. 6.

As a result of the test, the etched opacifying agent exhibited narrow particle distribution regardless of the number of etching, and having a uniform particle size was identified.

Meanwhile, in the opacifying agent of Comparative Example 1, particle size distribution was not able to be measured when the opacifying agent was dispersed into a solvent for analysis since the opacifying agent wend down in the dispersion medium without dispersion. From such results, it was seen that the opacifying agent of Comparative Example 1 had broad particle size distribution, and had no reproducibility.

In addition, zeta-potential of the opacifying agent was measured in water by carrying out the test in the same manner as above for the opacifying agent etched or used in Example 1 and Comparative Example 1. The results are shown in Table 1.

TABLE 1

|  | Example 1 | Comparative Example 1 |
|---|---|---|
| Zeta-Potential (mV) | −31.3 | −5.2 |

As a result of the test, the absolute value of the opacifying agent of Example 1 carrying out the etching process had a greatly increased absolute value of zeta-potential compared to the opacifying agent of Comparative Example 1 without the etching process. From such a result, it was seen that the content of the functional group increased on the surface of the opacifying agent of Example 1, and as a result, more superior dispersibility was expected to be exhibited.

Test Example 3

Dispersibility of the opacifying agents prepared in Example 1 and Comparative Example 1 was evaluated.

Figure 7:
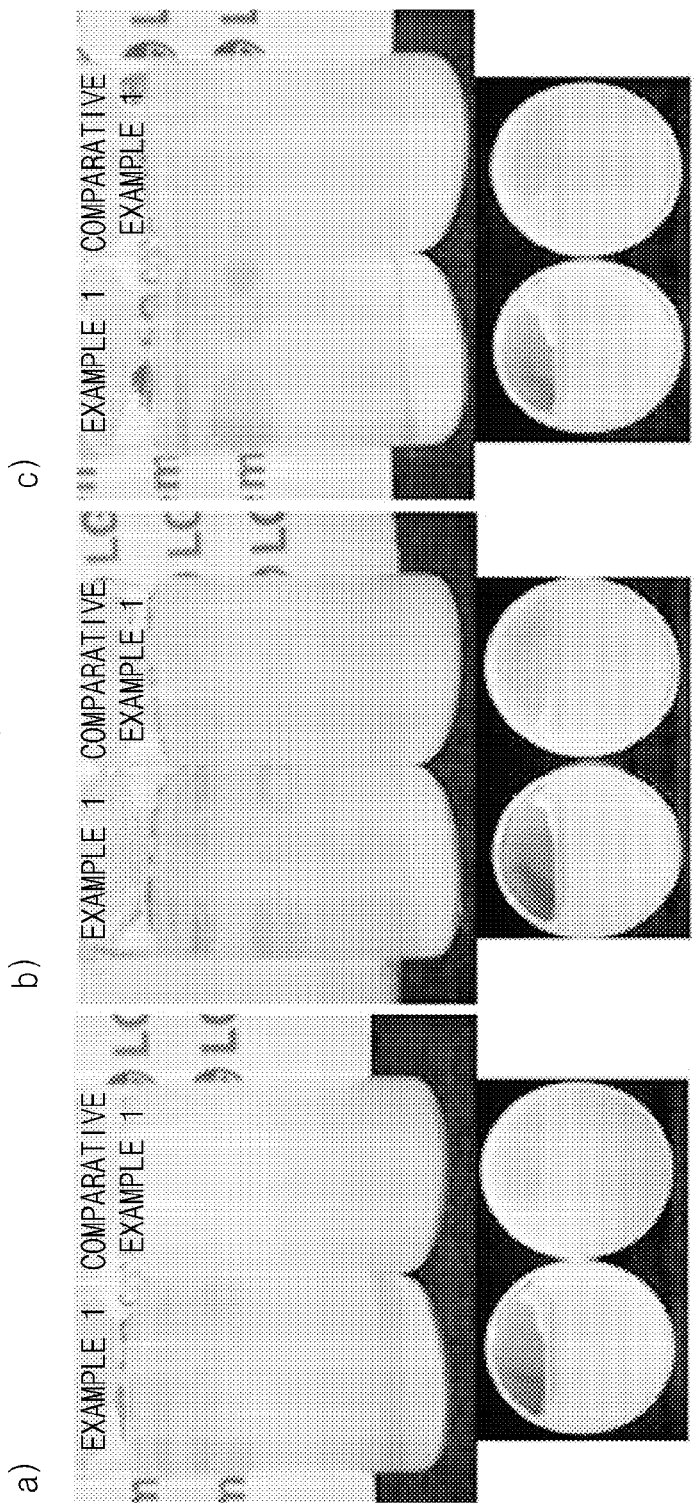
FIG. 7 is a picture observing changes in the dispersibility of opacifying agent-including compositions for forming a silica aerogel prepared in Example 1 and Comparative Example 1 depending on time (in FIG. 7, a) is immediately after preparation, b) is after standing still for 1 hour, and c) is after standing still for 3 hours).

As for the dispersion liquids including the etched $TiO_2$ prepared in Example 1 and Comparative Example 1, changes in the transparency of the dispersion liquid a) immediately after preparation, b) after being left still for 1 hour after preparation, and c) after being left still for 3 hours after preparation were each observed. The results are shown in FIG. 7.

As a result of the test, the opacifying agent-including dispersion liquid prepared in Example 1 exhibited higher transparency compared to the dispersion liquid of Comparative Example 1 immediately after preparation due to uniform dispersion of the etched opacifying agent. In addition, the opacifying agent-including dispersion liquid prepared in Example 1 had almost no changes in the transparency compared to Comparative Example 1 even after 3 hours from the preparation due to excellent dispersion stability. Meanwhile, in Comparative Example 1, the degree of opacification of the dispersion liquid was greatly reduced after 3 hours from the preparation of the dispersion liquid due to immersion of the opacifying agent.

Test Example 4

For each of the silica aerogel-including blankets prepared in Example 1 and Comparative Example 1, average weight loss, thermal conductivity (T/C) and true density were observed. The results are shown in the following Table 2.

Average weight loss: the blankets prepared in Example 1 and Comparative Example 1 were brushed three times with hands with identical strength, and then changes in the weights of the blankets from before the test were measured.

Thermal conductivity (T/C): thermal conductivity of each of the blankets of Example 1 and Comparative Example 1 was measured under a room temperature (25° C.) condition using a thermal conductivity measuring instrument (HFM436, prepared by NETZSCH).

True density: a weight ratio for unit volume of each of the blankets prepared in Example 1 and Comparative Example 1 was measured.

TABLE 2

|  | Comparative Example 1 | Example 1 |
|---|---|---|
| Average Weight Loss (g) | 0.15 g (White Lump) | 0.09 g (Fine Powder) |
| T/C (mW/mK) | 15.1 | 13.4 |
| True Density (g/cc) | 1.91 | 2.07 |

When considering that true density of a silica aerogel itself is 1.89 g/cc, and true density of rutile-type TiO$_2$ is 4.23 g/cc, the blanket according to Example 1 had high true density compared to Comparative Example 1. From such a result, it was seen that, in preparing the blanket, a larger amount of TiO$_2$ was more effectively included even when using the same amount due to an etching effect of the TiO$_2$.

In addition, as the content of the opacifying agent increased as above, the blanket of Example 1 exhibited thermal conductivity lower than Comparative Example 1 by 10% or higher.

The blanket of Example 1 also had a smaller average weight loss compared to Comparative Example 1. From such a result, it was seen that TiO$_2$ was attached to the blanket substrate with more superior adhesion when preparing the blanket due to an etching effect of the TiO$_2$.

Test Example 5

A specific surface area of the silica aerogel, a total pore volume in the silica aerogel and an average pore diameter in each of the silica aerogel-including blankets prepared in Example 1 and Comparative Example 1 were measured using a 3Flex (prepared by Micromeritics). The results are shown in the following Table 3.

TABLE 3

|  | Comparative Example 1 | Example 1 | Reference Example |
|---|---|---|---|
| Specific Surface Area (m$^2$/g) | 789.9 | 850.8 | 761.4 |
| Pore Volume (cm$^3$/g) | 3.41 | 3.70 | 3.20 |
| Pore Diameter (nm) | 12.23 | 12.07 | 12.55 |

In Table 3, the reference example is a value for the silica aerogel in the silica aerogel-including blanket prepared in the same manner as in Comparative Example 1 except that the opacifying agent was not used when preparing the blanket.

As a result of the test, a surface area of the prepared silica aerogel-including blanket increased due to an increase in the surface area of TiO$_2$ caused by etching, and it was identified that finer pores were formed with higher porosity compared to Comparative Example 1.

Test Example 6

For the silica aerogel-including blankets prepared in Example 1 and Comparative Example 1, changes in the hydrophobicity depending on high temperature treatment were observed.

In detail, carbon content of the silica aerogel-including blankets prepared in Example 1 and Comparative Example 1, and carbon content after heat treating the blankets for 10 hours each at 300° C. and 400° C. were measured with changes in the carbon (C) amount using a carbon analyzer. Each test was repeated twice. The results are shown in the following Table 4.

TABLE 4

| | C Content (wt %) | | | | | |
|---|---|---|---|---|---|---|
| | Room Temperature (23° C.) | | After Treating at 300° C./10 Hours | | After Treating at 400° C./10 Hours | |
| | Example 1 | Comparative Example 1 | Example 1 | Comparative Example 1 | Example 1 | Comparative Example 1 |
| First | 8.99 | 9.51 | 3.13 | 2.70 | 1.57 | 1.05 |
| Second | 8.95 | 10.11 | 2.99 | 2.59 | 1.45 | 1.02 |
| Average | 9.0 | 9.8 | 3.1 | 2.6 | 1.5 | 1.0 |

As a result of the test, the blanket of Example 1 experienced reduced hydrophobicity decline compared to Comparative Example 1 even after high temperature treatment due to an increase in the surface area of the etched TiO$_2$.

What is claimed is:

1. A silica aerogel-including blanket comprising:
a substrate for a blanket; and
a silica aerogel and an opacifying agent located at least at one of on a surface of the substrate for a blanket and inside the substrate for a blanket,
wherein the opacifying agent is prepared by dispersing inorganic particles into an aqueous basic solution and etching the particles,
wherein the opacifying agent is a second particulate having a structure formed by aggregation of inorganic particles of a first particulate, and includes 1 to 5 of the inorganic particles per unit volume of 1 μm$^3$,
wherein the opacifying agent has an average zeta-potential of −10 mV to −60 mV in water, and
wherein the second particulate has an average particle diameter of 300 nm to 600 nm and the first particulate has an average particle diameter of 100 nm to 300 nm.

2. The silica aerogel-including blanket of claim 1, wherein the inorganic particle includes any one, or two or more of condensation reactive functional groups selected from the group consisting of hydroxyl groups, alkoxy groups, carboxyl groups and ester groups on a surface of the particle.

3. The silica aerogel-including blanket of claim 1, wherein the inorganic particle has unevenness on a surface thereof.

4. The silica aerogel-including blanket of claim 1, wherein the inorganic particle includes any one, or two or more selected from the group consisting of metal oxides, metal carbides, metal nitrides, metal hydroxides, metal salts, carbon-based materials, ceramic particles and mixtures thereof.

5. The silica aerogel-including blanket of claim 1, wherein the inorganic particle includes any one titanium oxide selected from the group consisting of rutile-type TiO$_2$ and anatase-type TiO$_2$.

6. The silica aerogel-including blanket of claim 1, wherein the silica aerogel has a three-dimensional network structure with the first particles being bound.

7. The silica aerogel-including blanket of claim 1, wherein the silica aerogel has a specific surface area of 700 $m^2/g$ or greater.

8. The silica aerogel-including blanket of claim 1, wherein the silica aerogel is a hydrophobic silica aerogel having a carbon content of 8% by weight or greater with respect to a total weight of the silica aerogel.

9. The silica aerogel-including blanket of claim 1, wherein the substrate for a blanket further includes a surface hydrophobization layer on at least one surface of the substrate.

10. The silica aerogel-including blanket of claim 1, wherein the opacifying agent chemically binds to the silica aerogel to form an opacifying agent-silica aerogel complex.

* * * * *